United States Patent [19]

Baudouin

[11] Patent Number: 4,994,938
[45] Date of Patent: Feb. 19, 1991

[54] MOUNTING OF HIGH DENSITY COMPONENTS ON SUBSTRATE

[75] Inventor: Daniel A. Baudouin, Missouri City, Tex.

[73] Assignee: Texas Instruments Incorporated, Dallas, Tex.

[21] Appl. No.: 290,972

[22] Filed: Dec. 28, 1988

[51] Int. Cl.⁵ .............................................. H05K 1/18
[52] U.S. Cl. ..................................... 361/401; 29/840; 361/403
[58] Field of Search ................... 29/840, 841; 361/401, 361/403, 410; 428/131

[56] References Cited

U.S. PATENT DOCUMENTS 4,732,446 3/1988 Gipson et al. ........................ 361/401

FOREIGN PATENT DOCUMENTS 1240789 7/1971 United Kingdom ................ 361/401

Primary Examiner—Gregory D. Thompson
Attorney, Agent, or Firm—Ronald O. Neerings; Thomas W. Demond; Melvin Sharp

[57] ABSTRACT

A printed circuit board or other substrate mounts electrical components substantially ooplanar with the median plane or thickness of the board or substrate. The board furnishes an opening having bonding pads plated through the opening and fixed on the opposite sidewalls of the opening. The electrical component becomes placed in the the opening with solder paste between the bonding pads and end terminals of the electrical component. Reflow soldering techniques melt the solder paste into solder filets that solidify to fasten the electrical component within the opening in coplanar with the median plane or thickness of the board.

12 Claims, 2 Drawing Sheets

MOUNTING OF HIGH DENSITY COMPONENTS ON SUBSTRATE

BACKGROUND OF THE INVENTION

This invention relates generally to mounting electrical components on printed circuit boards and particularly relates to mounting the electrical components substantially coplanar with the median plane or thickness of the board using solder reflow techniques. This obtains a higher density of electrical components and circuit board than mounting the components on the surfaces of the circuit board.

Printed circuit card assemblies long have mounted components on one side or the other of the printed circuit board. Early, the components terminated in leads that passed through plated holes in the circuit board and that were crimped to fasten the components to the board. The board and components then passed through a solder bath or solder wave to finish the desired soldered electrical connections. Recently integrated circuit packages with gull wing leads or J-leads and lead-less but capped resistors, capacitors and inductors became mounted to circuit boards with surface mount technology. A solder paste is printed on the bonding pads formed on the circuit board. Mechanical pickers place the electrical components on the pads with the paste providing some adhesion of the components to the pads. The board and carried components then pass through a solder reflow oven or the like to melt the solder paste, with the surface tension of the molten solder holding the components in place on the pads. Afterwards, the solder solidifies mechanically to fastens the components to the board and electrically to connect the components in the circuits carried on the board.

Surface mount technology attains a greater component density than the earlier technology; it mounts more components on a certain area of printed circuit board through eliminating many plated through holes and eliminating or reducing the size and configuration of component leads. Surface mount technology achieves even greater density of components on the board by mounting such as decoupling capacitors under integrated circuit packages or carriers of such as dynamic random access memories (DRAMs). Further, components can be surface mounted on both sides of the printed circuit board.

SUMMARY OF THE INVENTION

The invention achieves additional component and printed circuit board density by using surface mount technology to mount components substantially coplanar with the median plane or thickness of the circuit board in openings formed through the circuit board. Several types of components such as capacitors, resistors and inductors have thicknesses of about or less than the thickness of the printed circuit board. Mounting these types of components coplanar with the median plane of the circuit board or within the thickness of the board frees both sides of the board for mounting other components or makes an assembly no thicker than the circuit board. Even components with thicknesses greater than the thicknesses of the board can be mounted coplanar with the median plane of the board to reduce the distance that they extend from one side or the other of the board.

In particular, the printed circuit board furnishes an opening dimensioned in length and width large enough to accommodate a certain component. The board defines the furnished through opening by peripheral walls of the circuit board material. The board also has a median plane parallel with both side surfaces of the board but half way between them and half way through the opening. For an axially arranged component such as a capacitor having a pair of opposed terminal end caps, the board also furnishes opposed pads of plated through conductive material carried on opposed walls of the board in the opening. The certain component becomes placed in the opening with its terminal end caps confronting the plated through pads and with solder paste, used in the surface mount technology, placed between the terminal end caps and the plated through pads. The board, component and solder paste then travel through the reflow oven where the solder paste melts. The surface tension of the molten solder then holds the component substantially centered in the opening both axially of the component and in the height of the opening to locate the component substantially coplanar with the median plane of the board. Later the solder solidifies to fasten the component securely in the opening and in the electrical circuit carried on the board.

An aid may be required to maintain the component in an opening until the solder melts if the solder paste lacks the necessary adhesive qualities. Further, components with multiple terminals will require multiple plated through pads on the walls of the opening and aligned to confront the terminals. The pads connect to other devices on the board or to board edge terminals through printed circuit leads, or otherwise as desired.

DESCRIPTION OF THE PREFERRED EMBODIMENTS

Figure 1:
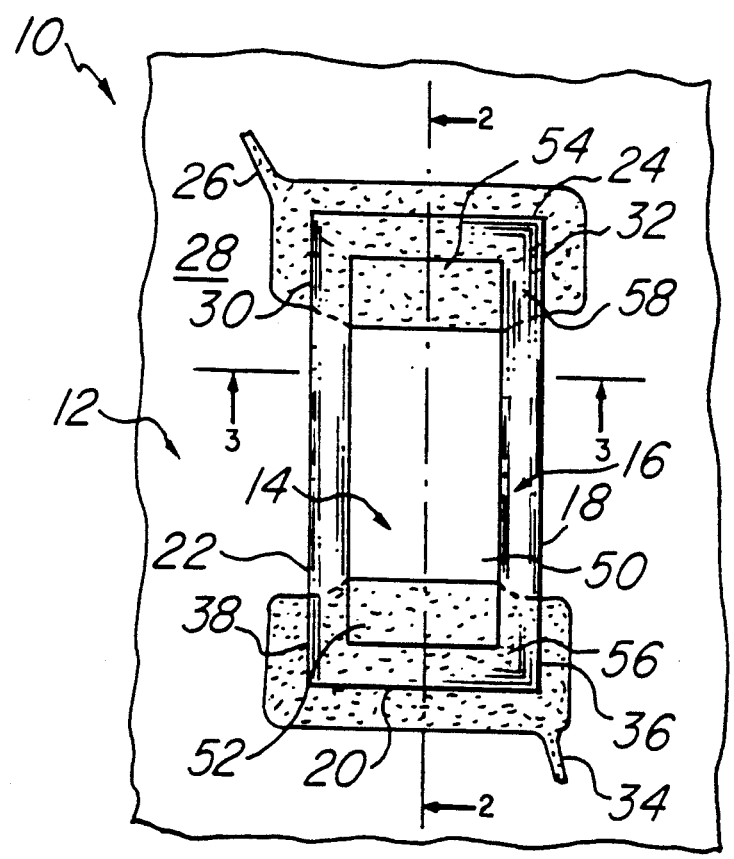
FIG. 1 is a plan view of a portion of a printed circuit board employing the invention to mount a component.
Figure 2:
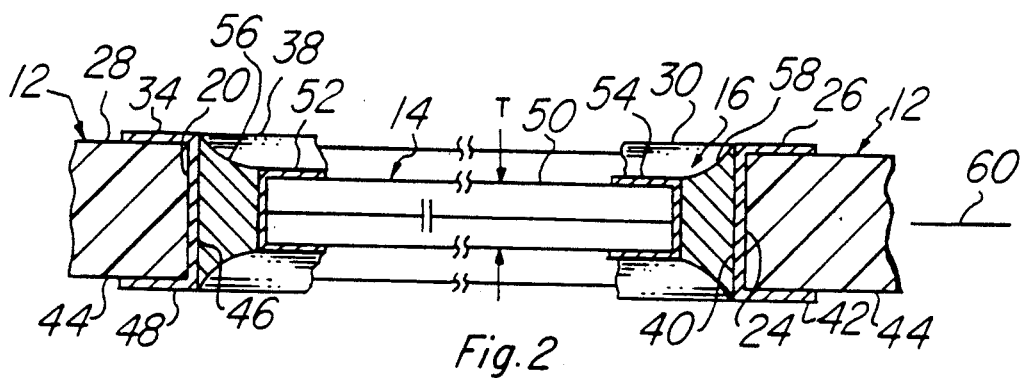
FIG. 2 is a cross-sectional view taken along the lines 2—2 of FIG. 1 and in the direction indicated by the arrows.

In FIGS. 1, 2, 3 and 4, circuit card assembly 10 comprises a printed circuit board 12 carrying a mounted capacitor 14.

Printed circuit board 12 furnishes an opening 16 defined by four sidewalls 18, 20, 22 and 24. A printed circuit lead 26 carried on the top surface 28 of the printed circuit board 12 extends to the wall 24 and adjacent portions 30 and 32 of walls 22 and 18. Another printed circuit lead 34 carried on the top surface 28 of the printed circuit board 12 extends to the wall 20 and portions 36 and 38 of walls 18 and 22. Leads 26 and 34 typically come formed of tin plated copper material using well know techniques.

Lead 26 extends down through opening 16 against wall 24 and the portions 30 and 32 of walls 22 and 18 to form a bonding pad 40. Lead 26 further extends beyond bonding pad 40 to part 42 carried on the bottom side 44 of the printed circuit board 12.

Lead 34 extends down through opening 16 against wall 20 and against parts 38 and 36 of walls 22 and 18 to form a bonding pad 46. Lead 34 extends beyond bonding pad 46 to form a part 48 carried on the bottom surface 44 of the printed circuit board 12.

Capacitor 14 comprises a body portion 50 carrying opposed end cap terminals 52 and 54. Capacitor 14 substantially has a thickness T less than the thickness of circuit board 12 between the top surface 28 and bottom surface 44. Capacitor 14 fits in opening 16 with its end cap terminal 52 confronting bonding pad 46 and with its end cap terminal 54 confronting bonding pad 40.

Figure 3:
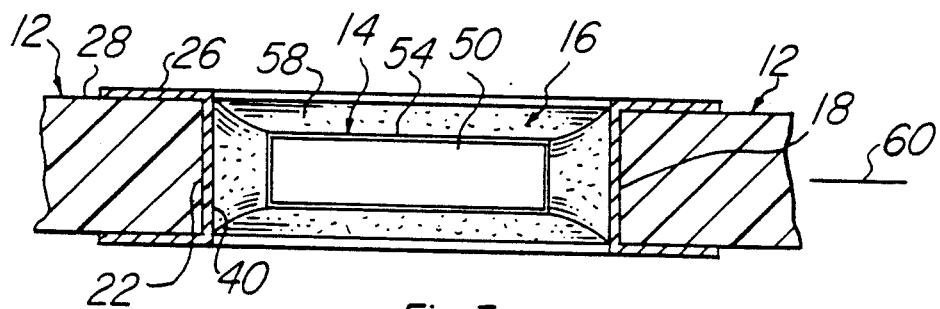
FIG. 3 is a cross-sectional view taken along the line 3—3 of FIG. 1 and in the direction indicated by the arrows.

Capacitor 14 becomes fastened in opening 16 and to printed circuit board 12 through filet 56 of solder between end cap terminal 52 and bonding pad 46 and throuhg filet 58 of solder between end cap terminal 54 and bonding pad 40. As depicted in FIGS. 1 and 3, filet 58 extends from wall 24 to terminal end cap 52 and from parts 30 and 32 of walls 22 and 18 to end cap terminal 54. In a like manner, filet 56 extends from wall 20 to end cap terminal 52 and from parts 36 and 38 of walls 18 and 22 to end cap terminal 52.

When the solder filets 56 and 58 are molten, the surface tension of the molten solder positions capacitor 14 substantially between the surfaces 28 and 44 of circuit board 12 to locate the capacitor 14 coplanar with the median plane 60 of the board 12 with the median plane 60 being located substantially half way between surfaces 28 and 44.

Figure 4:
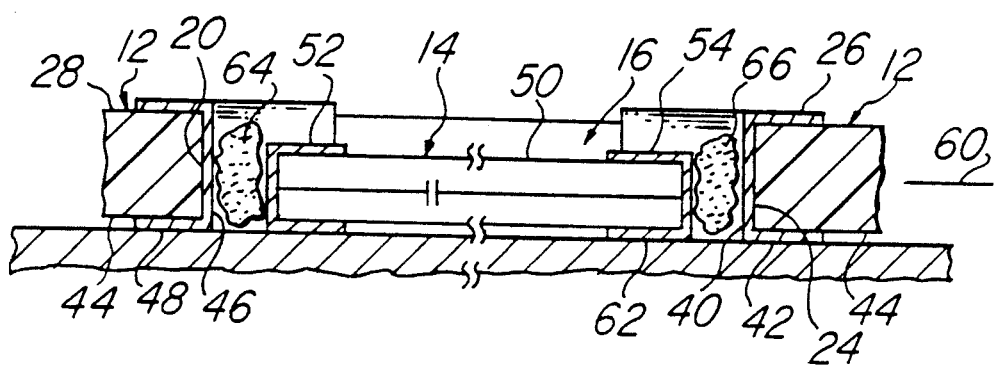
FIG. 4 is a cross-sectional view similar to that of FIG. 2 but with solder paste and a fixture supporting the component.

In FIG. 4, which depicts the mounting of the capacitor 14 in opening 16 before the melting of the solder to form the filets 56 and 58, a fixture 62 maintains the capacitor 14 within the opening 16. Quantities of solder paste 64 and 66 have been placed between the end cap terminals 52 and 54 and bonding pads 46 and 40. After manufacturing steps have placed these elements in the relative positions depicted in FIG. 4, the circuit board 12, the fixture 62, capacitor 14 and quantities of solder paste 64 and 66 are placed in a reflow oven to melt the solder paste into molten solder and form the solder filets 56 and 58. Thereafter the fixture 62 can be removed with the filets maintaining the capacitor 14 fastened within opening 16. Alternatively, the manufacturer can dispense with fixture 62 if the solder paste exhibits enough adhesive strength to maintain the capacitor 14 in the opening 16 until the circuit board 12 enters the reflow oven.

Modifications and variations of the invention can be obtained in light of the above teachings while remaining within the scope of the appended claims. For example, the opening 16 can be increased or decreased in size according to the size of the contained electrical component for positioning as desired. The only restraint on the size of the opening relative to the size of the contained electrode component exists for the solder filet to extend from the bonding pad or pads on the inside walls of the opening to the terminals on the contained electrical component. If the opening 16 becomes much larger than the electrical component to be contained in it, the solder will not form a filet to hold the electrical component in the opening. Of course the opening must remain large enough for mechanical fingers automatically to place the electrical component in the opening with some imprecision or tolerance in placement.

Opening 16 can be formed by any means desired such as sawing through the circuit board 12, punching or drilling.

Electrical components with more than two terminals can also find utility with the invention by forming plural bonding pads on the sidewalls of the opening aligned to confront the terminals of the electrical component to be inserted in the opening. For example, an integrated circuit package or carrier could be placed in an opening using this invention. Also, an electrical component having thicknesses greater than the distance between top and bottom surfaces 28 and 44 of circuit board 12 can use the invention while extending beyond the top and bottom surfaces of the circuit board 12. In all events, the contained electrical component substantially exists in the opening 16 coplanar with the median plane 60 of the circuit board 12.

Other uses of the invention include mounting electrical components in three layers, one layer substantially coplanar with the median plane of the circuit board and the other two layers resting on the surfaces 28 and 44 of the circuit board 12. The invention also can place the one electrical component coplanar with the median plane of the board and under such as an integrated circuit package carrier.

I claim:

1. A printed circuit card assembly comprising:
   A. a substrate of insulating material, said substrate having at least one opening through said substrate defined by sidewalls of said insulating material, said opening having dimensions between said sidewalls selected to receive an electrical component;
   B. circuit leads formed on said substrate, at least one lead extending into said opening to form one bonding pad on one sidewall and at least another lead extending into said opening to form another bonding pad on another sidewall, said one and another sidewalls being selected for said bonding pads to confront the terminals of the component;
   C. an electrical component dimensioned to fit in said opening, said component having terminals at its ends and being located in said opening with said terminals respectively confronting said one and another bonding pads; and
   D. a solder fillet extending between each said bonding pad and component terminal, said fillets substantially center and fasten the component in the opening both axially of the component and in the height of the opening to provide both mechanical and electrical connections between said one and another bonding pads and said component terminals.

2. The printed circuit card assembly of claim 1 in which said opening passes through said substrate, said substrate having opposed sides and a median plane between said opposed sides, and said solder fillets mounting said component substantially coplanar with the median plane of said substrate.

3. The printed circuit card assembly of claim 1 in which said substrate has a thickness and the component has a thickness less than said substrate.

4. The printed circuit card assembly of claim 1 in which said one and another bonding pads oppose one another and said component has terminals on opposed ends.

5. The printed circuit card assembly of claim 1 in which each bonding pad occurs on one of said sidewalls and adjacent parts of adjacent sidewalls and each fillet extends from one of said sidewalls and adjacent parts of adjacent sidewalls to one component terminal.

6. The printed circuit card assembly of claim 1 in which said component is a capacitor.

7. A process of making a printed circuit board assembly comprising:
   A. forming an opening in a substrate of insulating material, said forming including selecting dimensions of said opening adapted to receive a component;
   B. producing circuit leads on said substrate, said producing including extending at least one lead into said opening to form one bonding pad on one sidewall of said opening, extending at least another lead into said opening to form another bonding pad on another sidewall, and selecting said one and another sidewalls for said bonding pads to confront terminals of the component;
   C. placing in said opening an electrical component dimensioned to fit in said opening, said component having terminals at its ends and said placing including locating said component in said opening with said terminals confronting said one and another bonding pads; and
   D. melting solder paste in said opening to leave a solder fillet extending between each said bonding pad and component terminal, said fillets substantially center and fasten the component in the opening both axially of the component and in the height of the opening to provide both mechanical and electrical connections between said bonding pads and said component terminals.

8. The process of claim 6 including forming said opening through said substrate, said substrate having opposed sides and a median plane between said sides, and said melting includes mounting said component substantially coplanar with said median plane.

9. The process of claim 7 including selecting said component to have a thickness less than the thickness of said substrate.

10. The process of claim 7 in which said extending said leads includes extending said leads onto opposed sidewalls of said opening.

11. The process of claim 10 in which said extending said leads includes extending said leads onto said opposed sidewalls and parts of adjacent side walls of said opening.

12. The process of claim 7 in which said component is a capacitor.

* * * * *